United States Patent [19]

Mori

[11] Patent Number: 4,541,415
[45] Date of Patent: Sep. 17, 1985

[54] SOLAR RAY COLLECTING DEVICE

[76] Inventor: Kei Mori, 3-16-3-501, Kaminoge, Setagaya-ku, Tokyo, Japan

[21] Appl. No.: 592,690

[22] Filed: Mar. 23, 1984

[30] Foreign Application Priority Data

Jun. 3, 1983 [JP] Japan .................................. 58-99978

[51] Int. Cl.⁴ ............................ F24J 3/02; G02B 7/02
[52] U.S. Cl. ..................................... 126/440; 350/253
[58] Field of Search ................. 126/440, 418; 350/252, 350/253, 255

[56] References Cited

U.S. PATENT DOCUMENTS

| | | | |
|---|---|---|---|
| 4,026,267 | 5/1977 | Coleman | 126/440 |
| 4,057,048 | 11/1977 | Maine | 126/440 |
| 4,334,522 | 6/1982 | Dukess | 126/418 |
| 4,354,348 | 10/1982 | Lee | 126/440 |

Primary Examiner—William E. Lyddane
Assistant Examiner—Gerald A. Anderson
Attorney, Agent, or Firm—Jordan and Hamburg

[57] ABSTRACT

A solar ray collecting device is comprised of a supporting base plate on which a large number of hexagonal recesses are provided and a large number of optical systems are arranged on each of said recesses. Each of said optical systems is made up of a hexagonal focusing lens of a dimension that is approximately the same as the hexagonal recesses and of a head-cut hexagonal pyramid which extends downward from the light collecting lens as an upper surface of said recess. An optical conductor which is a light-receiving surface is provided on the focus of said light collecting lens. Furthermore, the upper internal circumferential surface of the side wall forming said recess is so formed that it may be able to move freely on the surface of said hexagonal pyramid.

16 Claims, 2 Drawing Figures

SOLAR RAY COLLECTING DEVICE

BACKGROUND OF THE INVENTION

This invention relates to a solar ray collecting device.

It has been previously proposed that various solar ray collecting devices be used in which the solar rays focused by a lense or the like are guided into an optical conductor cable and transmitted onto an optional desired place for the purpose of illumination or for other uses. One of the main solar ray collecting devices is the one in which a plurality of Fresnel lenses of approximately 40 cm in diameter (for example 7, 19, or 37 Fresnel lenses of the same diameter) are used for collecting solar rays on the light-receiving edge surface of an optical conductor cable of about 1 cm in diameter. It is then mounted at the focus of the Fresnel lenses and the solar rays focused by the Fresnel lenses are guided into the optical conductor cable and transmitted to the optional desired place through it. Another type of solar ray collecting device is one in which a large number of lenses, of less than about 4 cm in diameter, (for example 2,000 lenses of the same diameter) are used for collecting solar rays on the light-receiving edge of an optical fiber having a diameter of about 0.1 to 0.2 mm. These are precisely positioned at the focus of each lense, and the solar rays focused by each lense are then guided into them. The focal length of the lense is about 40 cm in the case of the former device while its focal length is about 4 cm or less in the case of the latter. Consequently the value of the latter is that it makes it possible to create a very thin solar ray collecting device. On the contrary there exist drawbacks in that the focus position of the lense needs to coincide precisely with the light-receiving edge surface, and as a result the lense and its supporting member tend to expand due to the extreme heat. This is especially true if the device is used in a desert, in space, or in a tropical area where the ambient temperature varies to a great extent. As a result the positional relationship between the focus position of the lense and the light-receiving edge surface of the optical fiber largely deviates from its predetermined relationship, and consequently the lense and its supporting member are apt to be destroyed by the extreme heat.

SUMMARY OF THE INVENTION

It is therefore an object of the present invention to provide a solar ray collecting device of the type in which a large number of lenses of about 4 cm or less in diameter are used to focus solar rays. It is another object of the present invention to provide a solar ray collecting device for effectively absorbing heat expansion of the lense and its supporting member in order to prevent them from being destroyed by extreme heat. Another object of the present invention is to provide a solar ray collecting device for enabling the focus position of each lense to always coincide with the light-receiving edge surface of the optical fiber.

A solar ray collecting device for enabling the focus position of a lense to always coincide with an optical fiber is made up of a supporting base plate on which a large number of optical systems are arranged. Each of the optical systems also has a hexagonal focusing lense of a dimension that is approximately the same as the hexagonal recesses; a head-cut hexagonal pyramid which extends downward from the light collecting lense as an upper surface of the recess; and an optical conductor which is a light-receiving surface provided on the focus of the light collecting lense. Furthermore, the upper internal circumferential surface of the side wall forming the recess is so formed that it may be able to move freely on the surface of the hexagonal pyramid.

The above and other features and advantages of the present invention will become apparent from the following detailed description which goes with the accompanying drawings.

DESCRIPTION OF THE PREFERRED EMBODIMENTS

Figure 1:
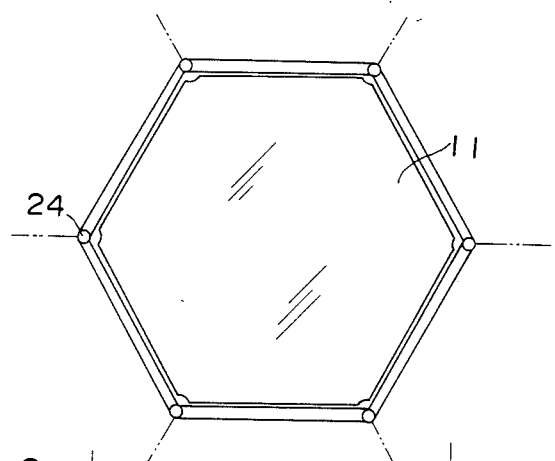
FIG. 1 is a plane view partly enlarged for explaining an embodiment of the present invention.
Figure 2:
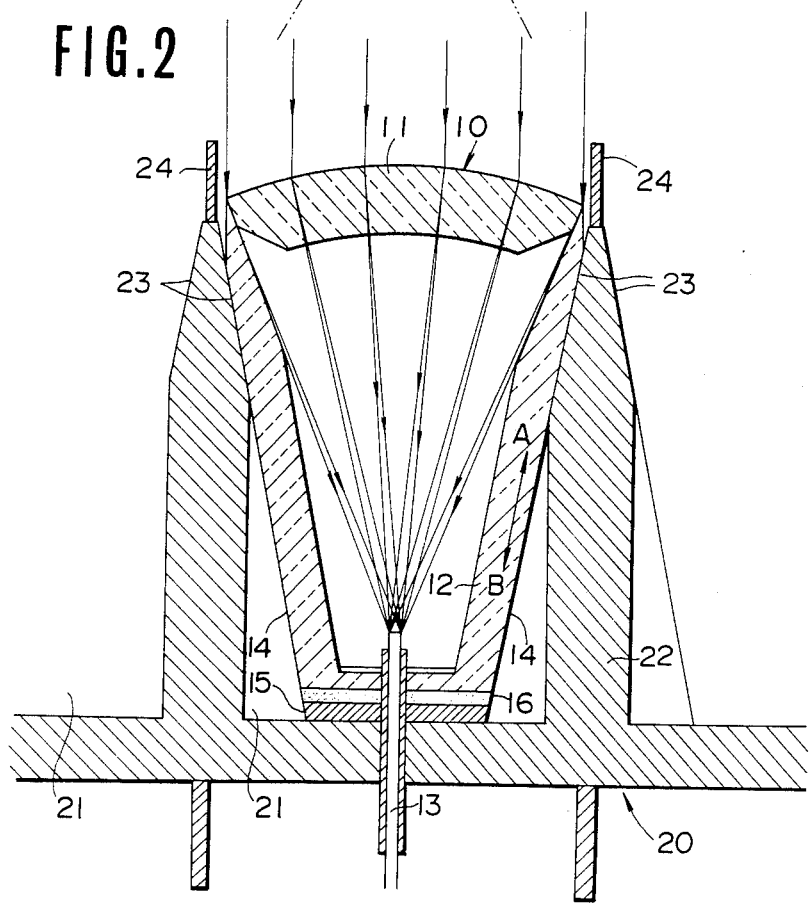
FIG. 2 is a cross-section view of FIG. 1.

FIG. 1 is a plane view partly enlarged for illustrating the components of the present invention. FIG. 2 is a cross-sectional view of FIG. 1.

In FIG. 1, 10 is an optical system, and 20 is its supporting member. In practice, a large number of optical systems (for example, 2,000 of them) are arranged on a supporting member 20. Basically each optical system 10 is composed of a hexagonal lense 11 of about 4 cm or less in diameter; a head-cut hexagonal pyramid 12, the upper surface of which is the lense 11; and an optical fiber 13, the light-receiving edge surface of which is precisely positioned at the focus of the lense 11. The solar ray focused by the lense 11 is guided into the optical fiber 13. A large number of hexagonal recesses 21 for accommodating the optical systems 10 are provided on the supporting member. The upper portion of the side wall 22 forming the recess 21 is formed as an inclined wall having the same slant as the pyramidal surface of the hexagonal pyramid 12. When the lense and the lense supporting member expand due to ambient heat, the hexagonal pyramid 12 of the optical system 10 rises, sliding along with the inclined surface 23 in the direction shown by the arrow at A. On the contrary, when they contract, the pyramid 12 sinks sliding along in the direction as shown by an arrow at B. On that occasion the focal position of the lense 11 does not change at all, and therefore the solar rays are always efficiently guided into the optical fiber 13. However, if the heat expansion rate of the lense is too great, there is a possibility that the neighboring lenses will collide with each other and will be destroyed. Supposing that a protection bar 24 is mounted on the top of the upper surface of the side wall 22, namely the place where the lenses are most probably apt to be destroyed, each lense will then collide with the protection bar first and this area of the lense will only partially be destroyed. Consequently it may be possible to prevent the lenses from being entirely destroyed by colliding with the sides of the neighboring lenses. The solar rays focused by the lense 11 and guided into the optical fiber 13 is a direct light beam delivered from the sun. On the other hand, an indirect light beam from the sun cannot be guided into the optical fiber. If such an indirect light is utilized it may be possible to suppress the heat expansion of the spectrum system. For this purpose transparent acrylic material hardened at high temperatures is used in the hexagonal pyramid 12 and aluminum evaporation is performed on its external surface in order to form a light-reflecting film 14. Furthermore, a solar battery 15 is mounted on the bottom surface of the hexagonal pyramid 12 and/or an inductive material 16 is provided on the same surface so as to let it circulate there for storing energy generated by the optical reaction due to light energy. In such a manner the indirect light beam delivered by the sun is guided into the hexagonal pyramid 12, and is effectively reflected by the use of the aluminum reflection surface 14. The indirect light guided to the bottom surface of the hexagonal pyramid 12 is converted into electric energy there or stored in the inductive material itself. On that occasion if a fluorescent substance is mixed into the transparent acrylic hexagonal pyramid, it may be possible to convert the light guided into it into a type of light having a certain wave length at which it can react most easily to the solar battery or to the inductive material. This latter possibility will make the solar ray more effective. Furthermore, it may be possible to perform aluminum evaporation on the internal surface of the hexagonal pyramid in order to form a reflecting surface on it. Since the light guided into the hexagonal pyramid may be deflected on the reflecting surface and be discharged outside, a temperature rise of the entire solar ray collecting device can be suppressed by the amount discharged. Only a device using a hexagonal pyramid has been explained thus far. However the present invention is not limited to only the afore-mentioned description. For instance, it is not always necessary to use a hexagonal pyramid (except for the surface which moves along with the recessed side wall of the supporting member). But it may also be possible to form a circular cone. If the sliding surface is formed in a round shape, it may be possible to utilize skylight more effectively since the sky's image is in a round shape.

As is apparent from the above-mentioned description, the optical system can be protected from being damaged due to heat expansion and it might be possible to provide a solar ray collecting device having the function of always collecting solar rays effectively even if the solar ray focusing lense moves due to heat expansion.

What is claimed is:

1. A solar ray collecting device comprising a supporting member, a plurality of recess means in said member, a pyramid means disposed in each of said recess means, said pyramid means having a bottom wall and side walls extending from said bottom wall, said side walls of said pyramid means generally slope outwardly form said bottom wall and having end portions defining a pyramid opening, a focusing lens disposed in said pyramid opening, an optical conductor extending through said bottom wall and having a light-receiving surface within said pyramid means, said light-receiving surface being disposed at the focus of said lens such that solar rays focused by said lens are guided into said optical conductor, and mounting means on said side walls of said pyramid means and on said lens for mounting said lens on said pyramid opening to provide for relative movement between said lens and said pyramid means while maintaining the focus of said lens on said light-receiving surface, whereby the solar ray device effectively collects solar rays under conditions where the lens moves relative to the pyramid means due to temperature changes.

2. A solar ray collecting device according to claim 1, wherein said recess means is a hexagonal recess.

3. A solar ray collecting device according to claim 2, wherein said lens is a hexagonal lens having dimensions approximately the same as the dimensions of said hexagonal recess.

4. A solar ray collecting device according to claim 1, wherein said side walls of said pyramid means are disposed to have a generally hexagonal configuration.

5. A solar ray collecting device according to claim 1, wherein said pyramid means has a generally central axis, said side walls sloping outwardly further away from said central axis as said pyramid opening is approached.

6. A solar ray collecting device according to claim 5, wherein said mounting means comprises an outer engaging surface at the outer extremity of said lens and an inner engaging surface on the inner surface of said end portions of said side walls, said outer and inner engaging surfaces being disposed at a fixed angle relative to said central axis such that said lens is movable along said second engaging surface as the lens expands and contracts due to temperature changes.

7. A solar ray collecting device according to claim 6, wherein said outer and inner engaging surfaces are disposed at a common angle relative to a longitudinal axis passing through the focus of said lens on said light-receiving surface such that imaginary linear extensions of said outer and inner engaging surfaces intersect the focus of said lens on said light-receiving surface.

8. A solar ray collecting device according to claim 1, wherein said recess means comprises recess walls which define a recess in which said pyramid means is received, said recess walls having recess wall end portions defining a recess opening, said recess wall end portions having an inner engaging recess surface, said pyramid means having an outer engaging surface on said end portions of said pyramid side walls, said outer engaging pyramid surface engaging said inner engaging recess surface such that said pyramid means is movable along said inner engaging recess surface as said pyramid means expands and contracts due to temperature changes.

9. A solar ray collecting device according to claim 8, wherein said inner engaging recess surface and said outer engaging pyramid surface are disposed at a common angle relative to a longitudinal axis passing through the focus of said lens on said light-receiving surface such that imaginary linear extensions of said inner engaging recess surface and imaginary linear extensions of said outer engaging pyramid surface intersect said longitudinal axis at a common intersection.

10. A solar ray collecting device according to claim 1 further comprising protection bar means disposed on said end portions of said side walls of said pyramid means.

11. A solar ray collecting device according to claim 1 wherein said pyramid means comprise a transparent, acrylic material.

12. A solar ray collecting device according to claim 1 further comprising a light-reflecting film formed by aluminum evaporation on at least portions of the external surface of said pyramid means.

13. A solar ray collecting device according to claim 1 further comprising a fluorescent substance mixed in with said pyramid means.

14. A solar ray collecting device according to claim 1 further comprising a solar battery mounted on said bottom wall of said pyramid means.

15. A solar ray collecting device according to claim 1 further comprising an inductive material on the outer surface of said bottom wall of said pyramid means, said inductive material storing light energy generated by an optical reaction.

16. A solar ray collecting device a-cording to claim 1 further comprising a light-reflecting film formed by aluminum evaporation on at least portions of the internal surface of said pyramid means.

* * * * *